US012598838B2

(12) United States Patent
Mayer et al.

(10) Patent No.: US 12,598,838 B2
(45) Date of Patent: Apr. 7, 2026

(54) SYSTEM AND METHODS FOR ACHIEVING A MICRO LOUVER EFFECT IN A PHOTOVOLTAIC CELL

(71) Applicant: Tesla, Inc., Palo Alto, CA (US)

(72) Inventors: Alex Christopher Mayer, Mill Valley, CA (US); Brian Edward Atchley, Petaluma, CA (US); Andreas Meisel, Novato, CA (US)

(73) Assignee: Tesla, Inc., Palo Alto, CA (US)

( * ) Notice: Subject to any disclaimer, the term of this patent is extended or adjusted under 35 U.S.C. 154(b) by 251 days.

(21) Appl. No.: 15/807,480

(22) Filed: Nov. 8, 2017

(65) Prior Publication Data

US 2018/0130921 A1      May 10, 2018

Related U.S. Application Data

(60) Provisional application No. 62/419,558, filed on Nov. 9, 2016.

(51) Int. Cl.
H01L 31/042      (2014.01)
H02S 20/25      (2014.01)
(Continued)

(52) U.S. Cl.
CPC .......... H10F 77/484 (2025.01); H02S 20/25 (2014.12); H10F 19/80 (2025.01); H10F 19/85 (2025.01);
(Continued)

(58) Field of Classification Search
CPC .............. H01L 31/0543; H01L 31/049; H01L 31/02168; H01L 31/02366; H01L 31/1804;
(Continued)

(56) References Cited

U.S. PATENT DOCUMENTS 2,354,091 A * 7/1944 Sharpe et al. .......... C03C 15/00
                                        216/88
3,076,861 A   2/1963 Samulon et al.
                (Continued)

FOREIGN PATENT DOCUMENTS

CN    101531468 A    9/2009
CN    203230326 U    10/2013
            (Continued)

OTHER PUBLICATIONS

Machine translation of JP2003152202, pp. 1-7 (Year: 2003).*
                (Continued)

*Primary Examiner* — Thanh Truc Trinh
(74) *Attorney, Agent, or Firm* — Foley & Lardner LLP

(57) ABSTRACT

Building integrated photovoltaic (BIPV) systems provide for solar panel arrays that can be aesthetically pleasing and appear seamless to an observer. Micro louvered structures can be incorporated into photovoltaic (PV) stacks, such that light entering a PV stack that is reflected off of embedded solar cells is not directed out at angles at which a typical observer would normally view the PV stack or roof on which a solar array is installed. Further, portions of the micro louvered structures can be coated with reflective, refractive, dielectric, and/or colored films such that underlying solar cells within the PV stack are obscured from the sightlines of a typical observer.

9 Claims, 10 Drawing Sheets

(51) Int. Cl.

| | | |
|---|---|---|
| *H10F 19/80* | (2025.01) | |
| *H10F 19/85* | (2025.01) | |
| *H10F 71/00* | (2025.01) | |
| *H10F 77/30* | (2025.01) | |
| *H10F 77/42* | (2025.01) | |
| *H10F 77/70* | (2025.01) | |

(52) U.S. Cl.

CPC ......... *H10F 71/121* (2025.01); *H10F 77/315* (2025.01); *H10F 77/488* (2025.01); *H10F 77/703* (2025.01); *H10F 77/707* (2025.01); *Y02A 30/60* (2018.01); *Y02B 10/10* (2013.01); *Y02E 10/52* (2013.01)

(58) Field of Classification Search

CPC ........... H01L 31/0547; H01L 31/02363; H01L 31/048; H02S 20/25; Y02A 30/60; Y02B 10/10; Y02E 10/52

See application file for complete search history.

(56) References Cited

U.S. PATENT DOCUMENTS

| | | | |
|---|---|---|---|
| 3,369,939 A | 2/1968 | Myer | |
| 3,461,602 A | 8/1969 | Hasel et al. | |
| 4,239,810 A | 12/1980 | Alameddine et al. | |
| 4,379,944 A * | 4/1983 | Borden | H01L 31/0236 |
| | | | 136/246 |
| 4,724,011 A | 2/1988 | Turner et al. | |
| 5,118,540 A | 6/1992 | Hutchison | |
| 5,338,369 A | 8/1994 | Rawlings | |
| 5,427,961 A | 6/1995 | Takenouchi et al. | |
| 5,667,596 A | 9/1997 | Tsuzuki et al. | |
| 5,942,048 A | 8/1999 | Fujisaki et al. | |
| 5,942,331 A | 8/1999 | Miyauchi et al. | |
| 6,133,522 A | 10/2000 | Kataoka et al. | |
| 6,222,117 B1 | 4/2001 | Shiozaki | |
| 6,311,436 B1 | 11/2001 | Mimura et al. | |
| 6,365,824 B1 | 4/2002 | Nakazima et al. | |
| 6,472,594 B1 | 10/2002 | Ichinose et al. | |
| 6,528,716 B2 | 3/2003 | Collette et al. | |
| 6,586,271 B2 | 7/2003 | Hanoka | |
| 6,960,716 B2 | 11/2005 | Matsumi et al. | |
| 7,259,321 B2 | 8/2007 | Oswald et al. | |
| 7,276,724 B2 | 10/2007 | Sheats et al. | |
| 7,506,477 B2 | 3/2009 | Flaherty et al. | |
| 7,534,956 B2 | 5/2009 | Kataoka et al. | |
| 7,772,484 B2 | 8/2010 | Li et al. | |
| 7,833,808 B2 | 11/2010 | Xu et al. | |
| 7,851,700 B2 | 12/2010 | Luch | |
| 7,858,874 B2 | 12/2010 | Ruskin et al. | |
| 7,902,451 B2 | 3/2011 | Shimizu | |
| 7,964,440 B2 | 6/2011 | Salleo et al. | |
| 8,124,437 B2 | 2/2012 | Huang et al. | |
| 8,148,194 B2 | 4/2012 | Fujii et al. | |
| 8,205,400 B2 | 6/2012 | Allen | |
| 8,206,664 B2 | 6/2012 | Lin | |
| 8,276,329 B2 | 10/2012 | Lenox | |
| 8,402,653 B2 | 3/2013 | Daniel et al. | |
| 8,471,141 B2 | 6/2013 | Stancel et al. | |
| 8,664,030 B2 | 3/2014 | Luch | |
| 8,674,209 B2 | 3/2014 | Hong et al. | |
| 8,674,377 B2 | 3/2014 | Farquhar | |
| 8,701,360 B2 | 4/2014 | Ressler | |
| 8,713,861 B2 | 5/2014 | Desloover | |
| 8,741,160 B2 | 6/2014 | Kim | |
| 8,822,810 B2 | 9/2014 | Luch | |
| 8,916,019 B2 | 12/2014 | Suga et al. | |
| 8,933,526 B2 * | 1/2015 | Tsakalakos | G02F 1/353 |
| | | | 257/E31.13 |
| 9,038,330 B2 | 5/2015 | Bellavia | |
| 9,054,240 B2 | 6/2015 | Kim et al. | |
| 9,150,966 B2 | 10/2015 | Xu et al. | |
| 9,206,520 B2 | 12/2015 | Barr et al. | |
| 9,343,592 B2 | 5/2016 | Hunt | |
| 9,362,527 B2 | 6/2016 | Takemura | |
| 9,368,665 B2 | 6/2016 | Fukumochi et al. | |
| 9,412,884 B2 | 8/2016 | Heng et al. | |
| 9,525,092 B2 | 12/2016 | Mayer et al. | |
| 9,825,582 B2 | 11/2017 | Fernandes et al. | |
| 9,899,554 B2 | 2/2018 | Yang et al. | |
| 9,966,487 B2 | 5/2018 | Magnusdottir et al. | |
| 2001/0054435 A1 | 12/2001 | Nagao et al. | |
| 2002/0015782 A1 | 2/2002 | Abys et al. | |
| 2003/0098059 A1 | 5/2003 | Hanoka | |
| 2003/0180983 A1 | 9/2003 | Oswald et al. | |
| 2004/0229394 A1 * | 11/2004 | Yamada | B32B 17/10 |
| | | | 438/66 |
| 2004/0261840 A1 | 12/2004 | Schmit et al. | |
| 2005/0039788 A1 | 2/2005 | Blieske et al. | |
| 2005/0268963 A1 | 12/2005 | Jordan et al. | |
| 2006/0048798 A1 | 3/2006 | Mccoy et al. | |
| 2006/0086620 A1 | 4/2006 | Chase et al. | |
| 2006/0204730 A1 | 9/2006 | Nakamura et al. | |
| 2008/0135085 A1 | 6/2008 | Corrales et al. | |
| 2008/0178928 A1 | 7/2008 | Warfield et al. | |
| 2008/0216887 A1 | 9/2008 | Hacke et al. | |
| 2008/0223436 A1 | 9/2008 | Den et al. | |
| 2009/0095341 A1 * | 4/2009 | Pfenninger | H01L 31/055 |
| | | | 136/246 |
| 2009/0101192 A1 | 4/2009 | Kothari et al. | |
| 2009/0114279 A1 | 5/2009 | Zhao et al. | |
| 2009/0120497 A1 | 5/2009 | Schetty, III | |
| 2009/0133739 A1 | 5/2009 | Shiao et al. | |
| 2009/0133740 A1 | 5/2009 | Shiao et al. | |
| 2009/0183764 A1 | 7/2009 | Meyer | |
| 2009/0233083 A1 | 9/2009 | Inoue et al. | |
| 2009/0242021 A1 | 10/2009 | Petkie et al. | |
| 2009/0287446 A1 | 11/2009 | Wang et al. | |
| 2009/0308435 A1 | 12/2009 | Caiger | |
| 2010/0000603 A1 | 1/2010 | Tsuzuki et al. | |
| 2010/0006147 A1 | 1/2010 | Nakashima et al. | |
| 2010/0018568 A1 | 1/2010 | Nakata | |
| 2010/0116332 A1 * | 5/2010 | Counil | H01L 31/0236 |
| | | | 136/256 |
| 2010/0132762 A1 | 6/2010 | Graham et al. | |
| 2010/0147363 A1 | 6/2010 | Huang et al. | |
| 2010/0154868 A1 | 6/2010 | Kourtakis et al. | |
| 2010/0180929 A1 | 7/2010 | Raymond et al. | |
| 2010/0252106 A1 * | 10/2010 | Peng | H01L 31/0547 |
| | | | 136/259 |
| 2010/0252107 A1 | 10/2010 | Suga | |
| 2010/0326522 A1 * | 12/2010 | Okaniwa | H01L 31/02168 |
| | | | 136/259 |
| 2011/0023282 A1 | 2/2011 | Daniel et al. | |
| 2011/0023937 A1 | 2/2011 | Daniel et al. | |
| 2011/0023942 A1 | 2/2011 | Soegding et al. | |
| 2011/0030761 A1 | 2/2011 | Kalkanoglu et al. | |
| 2011/0100418 A1 | 5/2011 | Maeda et al. | |
| 2011/0220195 A1 | 9/2011 | Moronaga et al. | |
| 2011/0240095 A1 | 10/2011 | Murillo-Mora et al. | |
| 2011/0277818 A1 | 11/2011 | Shimura | |
| 2011/0277825 A1 | 11/2011 | Fu et al. | |
| 2012/0012162 A1 | 1/2012 | Kobayashi | |
| 2012/0012741 A1 * | 1/2012 | Vasylyev | H01L 31/02327 |
| | | | 250/237 R |
| 2012/0031470 A1 | 2/2012 | Dimov et al. | |
| 2012/0048349 A1 | 3/2012 | Metin et al. | |
| 2012/0060911 A1 | 3/2012 | Fu et al. | |
| 2012/0125391 A1 | 5/2012 | Pinarbasi et al. | |
| 2012/0199184 A1 | 8/2012 | Nie et al. | |
| 2012/0229911 A1 | 9/2012 | Rodriguez-parada et al. | |
| 2012/0237670 A1 | 9/2012 | Lim et al. | |
| 2012/0325291 A1 | 12/2012 | Yokosawa et al. | |
| 2013/0025675 A1 | 1/2013 | Lee | |
| 2013/0048057 A1 | 2/2013 | Kalkanoglu et al. | |
| 2013/0048062 A1 | 2/2013 | Min et al. | |
| 2013/0048072 A1 | 2/2013 | Choi | |
| 2013/0061913 A1 | 3/2013 | Willham et al. | |
| 2013/0160823 A1 | 6/2013 | Khouri et al. | |
| 2013/0196140 A1 | 8/2013 | Lewis et al. | |
| 2013/0206213 A1 | 8/2013 | He et al. | |
| 2013/0209776 A1 | 8/2013 | Kim | |
| 2013/0233378 A1 | 9/2013 | Moslehi et al. | |

(56) References Cited

U.S. PATENT DOCUMENTS

| | | | |
|---|---|---|---|
| 2013/0247959 A1 | 9/2013 | Kwon et al. | |
| 2013/0255755 A1 | 10/2013 | Chich | |
| 2013/0276876 A1 | 10/2013 | Kerkar et al. | |
| 2013/0280521 A1 | 10/2013 | Mori | |
| 2013/0305528 A1 | 11/2013 | Anderson | |
| 2014/0034109 A1 | 2/2014 | Kim et al. | |
| 2014/0120699 A1 | 5/2014 | Hua et al. | |
| 2014/0124014 A1 | 5/2014 | Morad et al. | |
| 2014/0130866 A1 | 5/2014 | Yoshimine et al. | |
| 2014/0140012 A1 | 5/2014 | Wang et al. | |
| 2014/0144487 A1 | 5/2014 | Kim et al. | |
| 2014/0196768 A1 | 7/2014 | Heng et al. | |
| 2014/0216549 A1 | 8/2014 | Satoh et al. | |
| 2014/0313574 A1 | 10/2014 | Bills et al. | |
| 2014/0360582 A1 | 12/2014 | Cui et al. | |
| 2015/0075612 A1 | 3/2015 | Lin et al. | |
| 2015/0090314 A1 | 4/2015 | Yang et al. | |
| 2015/0155824 A1 | 6/2015 | Chien | |
| 2015/0162475 A1 | 6/2015 | Lee et al. | |
| 2015/0194552 A1 | 7/2015 | Ogasahara et al. | |
| 2015/0243931 A1 | 8/2015 | Fukuura | |
| 2015/0270410 A1 | 9/2015 | Heng et al. | |
| 2015/0349145 A1 | 12/2015 | Morad et al. | |
| 2015/0349152 A1 | 12/2015 | Voss et al. | |
| 2015/0349703 A1 | 12/2015 | Morad et al. | |
| 2016/0013329 A1 | 1/2016 | Brophy et al. | |
| 2016/0105144 A1 | 4/2016 | Haynes et al. | |
| 2016/0163902 A1 | 6/2016 | Podlowski | |
| 2016/0181446 A1 | 6/2016 | Kalkanoglu et al. | |
| 2016/0223729 A1 | 8/2016 | Medwick et al. | |
| 2016/0225931 A1 | 8/2016 | Heng et al. | |
| 2016/0284888 A1 | 9/2016 | Kobayashi | |
| 2017/0033250 A1 | 2/2017 | Ballif et al. | |
| 2017/0077343 A1 | 3/2017 | Morad et al. | |
| 2017/0194516 A1 | 7/2017 | Reddy et al. | |
| 2017/0222082 A1 | 8/2017 | Lin et al. | |
| 2018/0115275 A1 | 4/2018 | Flanigan et al. | |
| 2018/0122973 A1 | 5/2018 | Pilliod et al. | |
| 2018/0166601 A1 | 6/2018 | Inaba | |
| 2018/0269824 A1 | 9/2018 | Mayer et al. | |
| 2021/0202768 A1 | 7/2021 | Pilliod et al. | |

FOREIGN PATENT DOCUMENTS

| | | | | |
|---|---|---|---|---|
| CN | 203871349 U | 10/2014 | | |
| CN | 204216062 U | 3/2015 | | |
| CN | 102544380 B | 8/2015 | | |
| CN | 103426957 B | 3/2016 | | |
| CN | 102956730 B | 6/2016 | | |
| DE | 102007054124 A1 | 5/2009 | | |
| EP | 1058320 A2 | 12/2000 | | |
| EP | 1329433 A1 | 7/2003 | | |
| EP | 2051124 A2 | 4/2009 | | |
| EP | 2 410 575 A2 | 1/2012 | | |
| EP | 2709160 A1 | 3/2014 | | |
| GB | 2278618 A | 12/1994 | | |
| JP | 57-141979 A | 9/1982 | | |
| JP | 60-20586 A | 2/1985 | | |
| JP | 6-140657 A | 5/1994 | | |
| JP | 6-264571 A | 9/1994 | | |
| JP | 2000-91610 A | 3/2000 | | |
| JP | 2000-216415 A | 8/2000 | | |
| JP | 2000323740 A | 11/2000 | | |
| JP | 2001-119054 A | 4/2001 | | |
| JP | 2003152202 | * 5/2003 | ............ | H01L 31/04 |
| JP | 2005-41120 A | 2/2005 | | |
| JP | 2010199439 A | 9/2010 | | |
| JP | 2010245275 A | 10/2010 | | |
| JP | 2013-211385 A | 10/2013 | | |
| JP | 2014-36130 A | 2/2014 | | |
| WO | 2008/136872 A2 | 11/2008 | | |
| WO | 2009/062106 A1 | 5/2009 | | |
| WO | 2009/099418 A2 | 8/2009 | | |
| WO | 2009/134208 A1 | 11/2009 | | |
| WO | 2010/128375 A2 | 11/2010 | | |
| WO | 2011/128757 A1 | 10/2011 | | |
| WO | 2012/133973 A1 | 10/2012 | | |
| WO | 2013/059441 A1 | 4/2013 | | |
| WO | 2013/067541 A1 | 5/2013 | | |
| WO | 2013/102181 A1 | 7/2013 | | |
| WO | 2014/178180 A1 | 11/2014 | | |
| WO | 2015/155356 A1 | 10/2015 | | |
| WO | 2016/090341 A1 | 6/2016 | | |

OTHER PUBLICATIONS

International Search Report and Written Opinion mailed Apr. 4, 2018 in International Patent Application No. PCT/US2017/060858. 19 pages.

International Preliminary Report on Patentability mailed May 23, 2019 in International Application No. PCT/US2017/060858. 11 pages.

Invitation to Pay Additional Fees and, Where Applicable, Protest Fee, and Communication Relating to the Results of the Partial International Search, mailed Feb. 9, 2018, for corresponding International Application PCT/US2017/060858, 15 pages.

Notice of Allowance received for U.S. Appl. No. 15/796,683, mailed on Nov. 4, 2020, 8 pages.

Advisory Action received for U.S. Appl. No. 15/796,683, mailed on Aug. 24, 2020, 6 pages.

Bulucani et al., "A New Approach: Low Cost Masking Material and Efficient Copper Metallization For Higher Efficiency Silicon Solar Cells", IEEE, 2015, 6 pages.

Extended Search Report received for European Patent Application No. 17865516.3, mailed on May 28, 2020, 7 pages.

Fan et al., "Laser Micromachined Wax-Covered Plastic Paper as Both Sputter Deposition Shadow Masks and Deep-Ultraviolet Patterning Masks for Polymethylmacrylate-Based Microfluidic Systems", vol. 12, No. 4, Journal of Micro/ Nanolithography, MEMS, and MOEMS, Oct. 2013, pp. 1-6.

Final Office Action received for U.S. Appl. No. 15/796,683, mailed on Mar. 2, 2020, 9 pages.

Final Office Action received for U.S. Appl. No. 15/924,842, mailed on Sep. 6, 2019, 11 pages.

International Preliminary Report on Patentability received for PCT Patent Application No. PCT/US2017/059115, mailed on May 9, 2019, 11 pages.

International Search Report and Written Opinion received for PCT Patent Application No. PCT/US2017/059115, mailed on Jan. 29, 2018, 12 pages.

Non-Final Office Action received for U.S. Appl. No. 15/796,683, mailed on Oct. 17, 2019, 10 pages.

Non-Final Office Action received for U.S. Appl. No. 15/924,842, mailed on Jan. 28, 2019, 8 pages.

Office Action received for European Patent Application No. 17801289. 4, mailed on Sep. 4, 2020, 8 pages.

"Optical Constant of SiO2 (Silicon dioxxide, Silica, Quartz)", Refractive index of SiO2 (Silicon dioxide, Silica, Quartz)— Kischkat, Online Available at: <https://refractiveindex.info/?shelf= main&book=SiO2&page=Kischkat>, retrieved on Sep. 1, 2019, 3 pages.

"Optical Constants of Plastics", Refractive index of Plastics— pmma, Online Available at: <https://refractiveindex.info/?shelf=3d &book=plastics&page=pmma>, retrieved on Sep. 1, 2019, 2 pages.

Pelisset et al., "Efficiency of Silicon Thin-Film Photovoltaic Modules with a Front Coloured Glass", Proceeding of the CISBAT International Conference, 2011, 6 pages.

Poole et al., "Recovery Act: Organic Coatings as Encapsulants for Low Cost, High Performance PV Modules", Final Technical Report, PPG Industries Inc., Nov. 16, 2011, 35 pages.

Vyas et al., "An Inorganic/Organic Hybrid Coating for Low Cost Metal Mounted Dye-Sensitized Solar Cells", 223rd ECS Meeting, The Electrochemical Society, 2013, 1 page.

Office Action received for Chinese Patent Application No. 201780073009.7, mailed on Feb. 3, 2021, 10 pages (4 pages of English Translation and 6 pages of Official Copy).

(56) References Cited

OTHER PUBLICATIONS

Office Action received for Chinese Patent Application No. 201780073009.7, mailed on Oct. 18, 2021, 10 pages (6 pages of English Translation and 4 pages of Official Copy).

Non-Final Office Action received for U.S. Appl. No. 17/184,866, mailed on May 18, 2022, 18 pages.

Office Action received for European Patent Application No. 17865516.3, mailed on Mar. 17, 2022, 4 pages.

* cited by examiner

SYSTEM AND METHODS FOR ACHIEVING A MICRO LOUVER EFFECT IN A PHOTOVOLTAIC CELL

CROSS-REFERENCE TO RELATED APPLICATIONS

This claims benefit of priority to U.S. Provisional Application No. 62/419,558 filed on Nov. 9, 2016, entitled "SYSTEM AND METHODS FOR ACHIEVING A MICRO LOUVER EFFECT IN A PHOTOVOLTAIC CELL," the entirety of which is hereby incorporated by reference for all purposes.

TECHNICAL FIELD

The disclosure is directed to photovoltaic systems and in particular to systems and methods for providing micro louvers in solar roof and/or building integrated photovoltaic roof tiles, shingles, etc. to cause the internal solar cells to be obscured or concealed at certain angles while remaining visible to incident overhead sunlight.

BACKGROUND

Solar power, also referred to as photovoltaics (PV), is becoming increasingly popular in the United States and as well as in other parts of the developed and developing world. However, current products are geared primarily to the retrofit market, which involves installing conventional PV modules over a composition shingle, tile, slate or other type of roof, either on top of rails or with rail-free mounting hardware. As a result, solar penetration in the new construction and re-roof markets has been relatively low even though there are many more new home starts each year and even more old roofs that are re-roofed with conventional roofing materials.

Recognition of this reality has inspired the recent development and publicizing of so-called solar roofs that are made of many small photovoltaic tiles or shingles that function just like traditional roofing materials but that contain embedded solar cells and other photovoltaic components. Although solar shingles and roof tiles have been around for a decade more, conventional building integrated photovoltaic (BIPV) products failed to deliver a uniform appearance, and therefore, were only marginally more appealing than conventional solar. Previous solar shingle and tile products result in an obvious visual difference between roofing materials that contained embedded PV and those that did not. This difference is visible at the street level and even from far away. This may explain why conventional solar tile and roof shingle products suffered have suffered from low levels of consumer demand.

Recently, there have been solar roofing products developed that utilize films that contain embedded features that prevent or impede or redirect reflected light so that when the these products are viewed at an angle, the embedded solar cells disappear, while viewing from a range of angles closer to perpendicular, the solar cells remain visible. Therefore, energy production is only slightly impacted by the use of these films. The effect is similar to louvered blinds, which disappear when viewed head-on but become increasingly opaque when viewed at increasing viewing angles. Although these films are demonstrably effective at concealing the underlying PV, they add cost and complexity to each solar shingle/tile. Also, their use may require additional ultraviolet (UV) blocking materials that will further increase costs and impact energy production.

BRIEF SUMMARY

Various embodiments of the disclosure provide systems, methods, and apparatuses for concealing and/or coloring solar cells as part of photovoltaic panels mounted on the roof of a structure to make them less noticeable and/or completely invisible from a typical street-level viewing angles without significantly impacting energy production. In some embodiments, controlling the viewable portions of photovoltaic panels or tiles is accomplished by using pre-treated PV glass having a pattern of notches formed on an underside thereof within the PV laminate stack-up. A portion of the notches may be filled or layered with a material having a different index of refraction ($I_R$) than the top layer of glass in the PV laminate stack-up (alternatively referred to as the "top-glass").

Other embodiments utilize pre-treated PV glass having a pattern of notches formed on a top surface thereof in the PV laminate stack-up. In various embodiments, these notches may be filled with a fluorinated polymer or other suitable ultraviolet (UV) and environmentally stable material. Again, such materials can have a different index of refraction ($I_R$) than the top layer of glass of the PV laminate stack-up.

Still further embodiments can utilize an anti-reflective coating (ARC) formed over the top layer of glass of a PV laminate stack-up. In various embodiments, a portion of this ARC may be periodically stained, colored, or otherwise treated to alter the reflectivity and/or transmissivity of those portions of the ARC.

Additional embodiments may achieve a micro louver effect by inserting an intermediary film between two layers of encapsulate material in the PV laminate stack above the photovoltaic cells. In various embodiments, this film layer may have a saw tooth-shaped profile. Optionally, the intermediary film can have a different index of refraction ($I_R$) than other layers of the PV laminate stack-up.

Finally, further embodiments of the invention accomplish a micro louvered affect by forming the a PV cell with textured top surface that is coated with an ARC. The ARC is then coated with a dielectric material that is deposited on the ARC at an angle with respect to the texturized top surface. In various embodiments, the dielectric material will have a different index of refraction ($I_R$), be made of a different color material, or both. As a result or orienting the wafer surface relative to the direction of incident light dispersement, one facet or direction of the texturized surface will receive a greater amount of dielectric material than the others.

The above and other embodiments will be more explained with greater detail in the following description.

BRIEF DESCRIPTION OF THE DRAWINGS

Illustrative aspects of the present disclosure are described in detail below with reference to the following drawing figures. It is intended that that embodiments and figures disclosed herein are to be considered illustrative rather than restrictive.

FIG. 1A shows a first exemplary micro louvered PV laminate stack according to various embodiments of this technology.

FIG. 1B shows a detail view the exemplary micro louvered PV laminate stack shown in FIG. 1A.

FIG. 2A shows a second exemplary micro louvered PV laminate stack according to various embodiments of this technology.

FIG. 2B shows a detail view the exemplary micro louvered PV laminate stack shown in FIG. 2A.

FIG. 4A shows a second exemplary micro louvered PV laminate stack according to various embodiments of this technology.

FIG. 4B shows a detail view the exemplary micro louvered PV laminate stack shown in FIG. 4A.

DETAILED DESCRIPTION

Figures 3A, 3B:
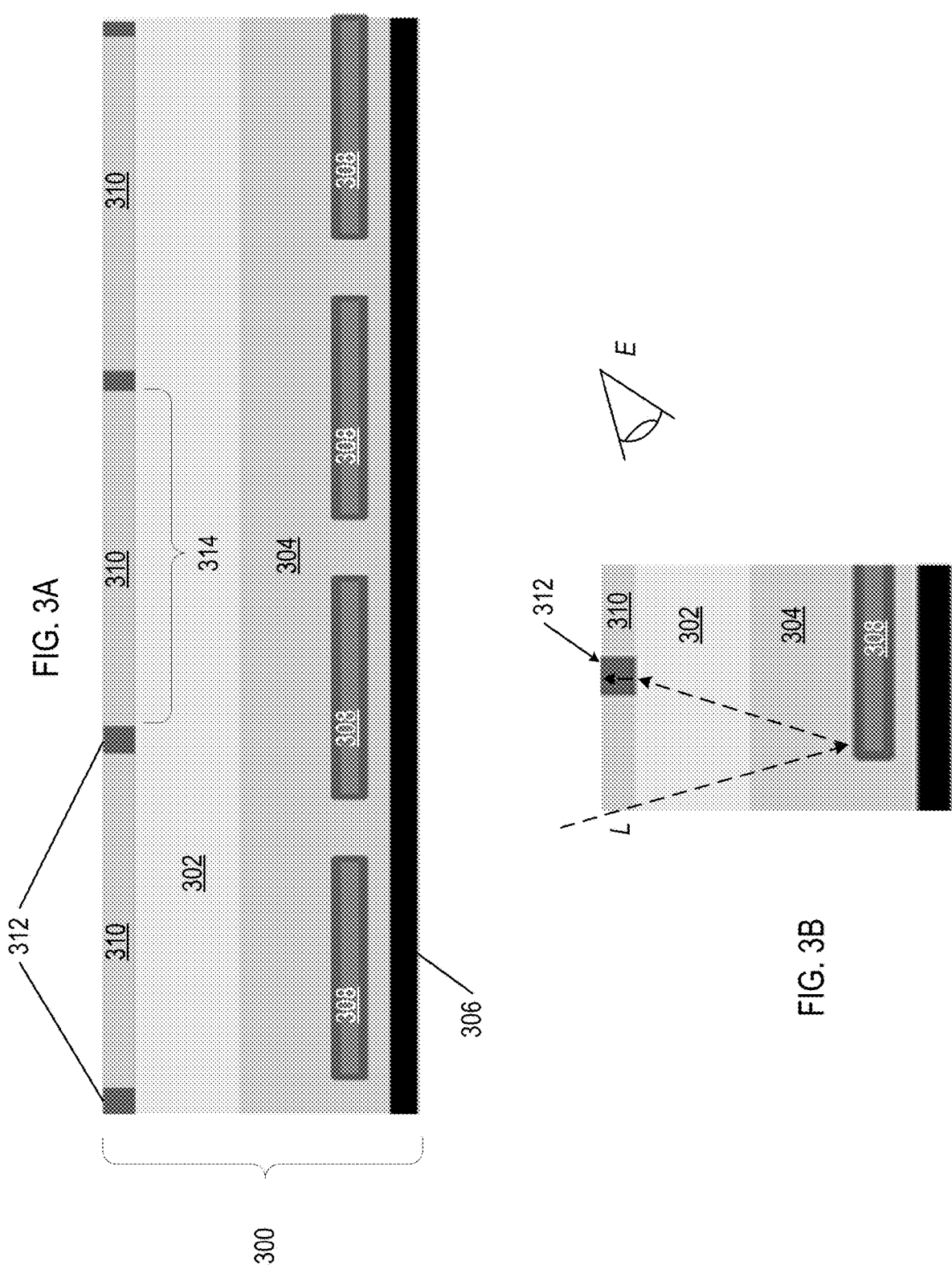
FIG. 3A shows a second exemplary micro louvered PV laminate stack according to various embodiments of this technology.
FIG. 3B shows a detail view the exemplary micro louvered PV laminate stack shown in FIG. 3A.

The present disclosure describes various embodiments of photovoltaic roofing systems and associated systems and methods. Some embodiments relate to building integrated photovoltaic module assemblies and associated systems and methods. In various embodiments, the systems described herein lower costs of conventional systems in which a PV system is installed over a roof, and at the same time can provide an improved aesthetic for a PV roof system.

Certain details are set forth in the following description and in the Figures to provide a thorough understanding of various embodiments of the present technology. Other details describing well-known structures and systems often associated with PV systems, roofs, etc., however, are not set forth below to avoid unnecessarily obscuring the description of the various embodiments of the present technology.

The disclosed PV laminate stacks are formed with a micro louver structure, where the micro louver structure can function to alter the angle of incidence, the angle of reflection, and/or the angle of refraction of light interacting with PV cells embedded within the PV laminate stacks. The micro louver structure can have refractory features or characteristics (e.g., a differential index of refraction) that alters direction of light passing through or reflecting off of the micro louver structure. Generally, the disclosed micro louver structure is positioned above the PV cells within the PV laminate stack. In some aspects, the micro louver structure can be used independently of, or in combination with, reflective materials or structures positioned below the PV cells within the PV laminate stack. In various aspects, the micro louver structure can cover substantially the complete area of a PV laminate stack, such that the surface are of a solar cell having a PV laminate stack including a micro louver structure does not reflect light at an undesired angle.

As part of a solar cell, the micro louver structure of a PV laminate stack can control the direction of light emanating or reflecting from the solar cell. Accordingly, a PV panel or module having such solar cells can be mounted on a roof (or other analogous structure) and, by selection and orientation of the solar cells, direct light out at angles away from a street or ground level observer proximate to the roof and its underlying structure. Instead, an observer at street or ground level, when looking at the solar cells having the micro louver structure, will instead see a portion of micro louver structure configured to blend in or appear seamless with the roof. In this manner, the appearance of the roof is aesthetically pleasing and any visual contrasts due to the mixed use of PV elements and non-PV elements on the same roof are minimized.

From this disclosure, it can be understood that such micro louvered PV laminate stacks can be incorporated into various forms of BIPV tiling structures, such that the solar energy collecting elements leverage the advantage of the micro louver structures to minimize sharp contrasts in appearance or discontinuations between parts of a roof having solar array components and parts of the same roof without PV elements. Such solar arrays impart the roof on which they are installed with a more natural and aesthetically pleasing appearance, which in various aspects can be by having an appearance that is at least partially uniform, patterned, textured, and/or random.

Many of the details, dimensions, angles and other features shown in the Figures are merely illustrative of particular embodiments. Accordingly, other embodiments can include other details, dimensions, angles and features without departing from the spirit or scope of the present invention. Various embodiments of the present technology can also include structures other than those shown in the Figures and are expressly not limited to the structures shown in the Figures. Moreover, the various elements and features shown in the Figures may not be drawn to scale. In the Figures, identical reference numbers identify identical or at least generally similar elements.

As used herein, the term "substantially" refers to the complete or nearly complete extent or degree of an action, characteristic, property, state, structure, item, or result. For example, an object that is "substantially" uniform in height to another object would mean that the objects are either completely or nearly completely uniform in height. The exact allowable degree of deviation from absolute completeness may in some cases depend on the specific context, however, generally speaking, the nearness of completion will be so as to have the same overall result as if absolute and total completion were obtained.

As used herein, the term "about" is used to provide flexibility to a numerical range endpoint by providing that a given value may be greater than or less than the value. As used herein unless otherwise indicated, the given value modified by about can vary by ±10%.

Wherever used throughout the disclosure and claims, the term "generally" has the meaning of "approximately" or "closely" or "within the vicinity or range of". The term "generally" as used herein is not intended as a vague or imprecise expansion on the term it is selected to modify but rather, as a clarification and potential stop gap directed at those who wish to otherwise practice the appended claims but seek to avoid them by insignificant, or immaterial or small variations. All such insignificant, or immaterial or small variations should be covered as part of the appended claims by use of the term "generally".

As used herein, the term "building integrated photovoltaic system" or "BIPV" generally refers to photovoltaic systems integrated with building materials to form at least a portion of a building envelope. For example, the BIPV system can form the roof or roofing membrane of a building. The BIPV systems described herein can be retrofitted, can be a part of a new construction roof, or a combination of both. The PV modules or panels can be used as the actual building envelope (e.g., roofing membrane) to provide a watertight or substantially watertight seal, or may be affixed over the building envelope in a manner that simulates the appearance of BIPV without having the PV system components be part of the building envelope. As used herein, the term "BIPV system" may be used to refer to either configuration.

As used herein, the terms "up-roof" and "down-roof" are used to provide orientation, direction, position, or a reference point relative to or in context of a roof or roofing surface upon which the systems described herein are installed on and/or form a portion of. Up-roof generally refers to an orientation that is relatively closer to the roof ridge while down-roof refers to an orientation that is relatively closer to the roof eave.

As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms describing the subject matter of the disclosure, such as "beneath", "below", "lower", "above", "upper", "over", and the like, may be used herein for ease of description to describe one element or feature's relationship to another element(s) or feature(s) as shown in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, term such as "below" can encompass both an orientation of above and below, depending on the context of its use. The device may be otherwise oriented (rotated 90 degrees or at other orientations) and the spatially relative descriptors used herein are interpreted accordingly.

Although the terms "first", "second", etc. may be used herein to describe various elements, components, regions, layers and/or sections, it should be understood that they should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

Generally, PV modules are crystalline-based solar panels, which can be either or both of monocrystalline solar panels or polycrystalline (multi-crystalline) solar panels. The laminate or wafer forming the solar energy-collecting surface of such PV modules can be mechanically coupled, adhered, or bonded to structurally supporting pans. In some embodiments, PV modules can include layers of amorphous silicon or thin film variations of solar energy-collecting laminates. Alternatively, thin-film PV modules, such as cadmium telluride, copper indium gallium diselenide ("CIGS"), or amorphous thin-film silicon may be used. In still further embodiments, cells based on perovskite or other as of yet noncommercialized materials may be used. The particular type of cell technology used is a design choice and not critical to the various embodiments of the invention.

Figures 1A, 1B:
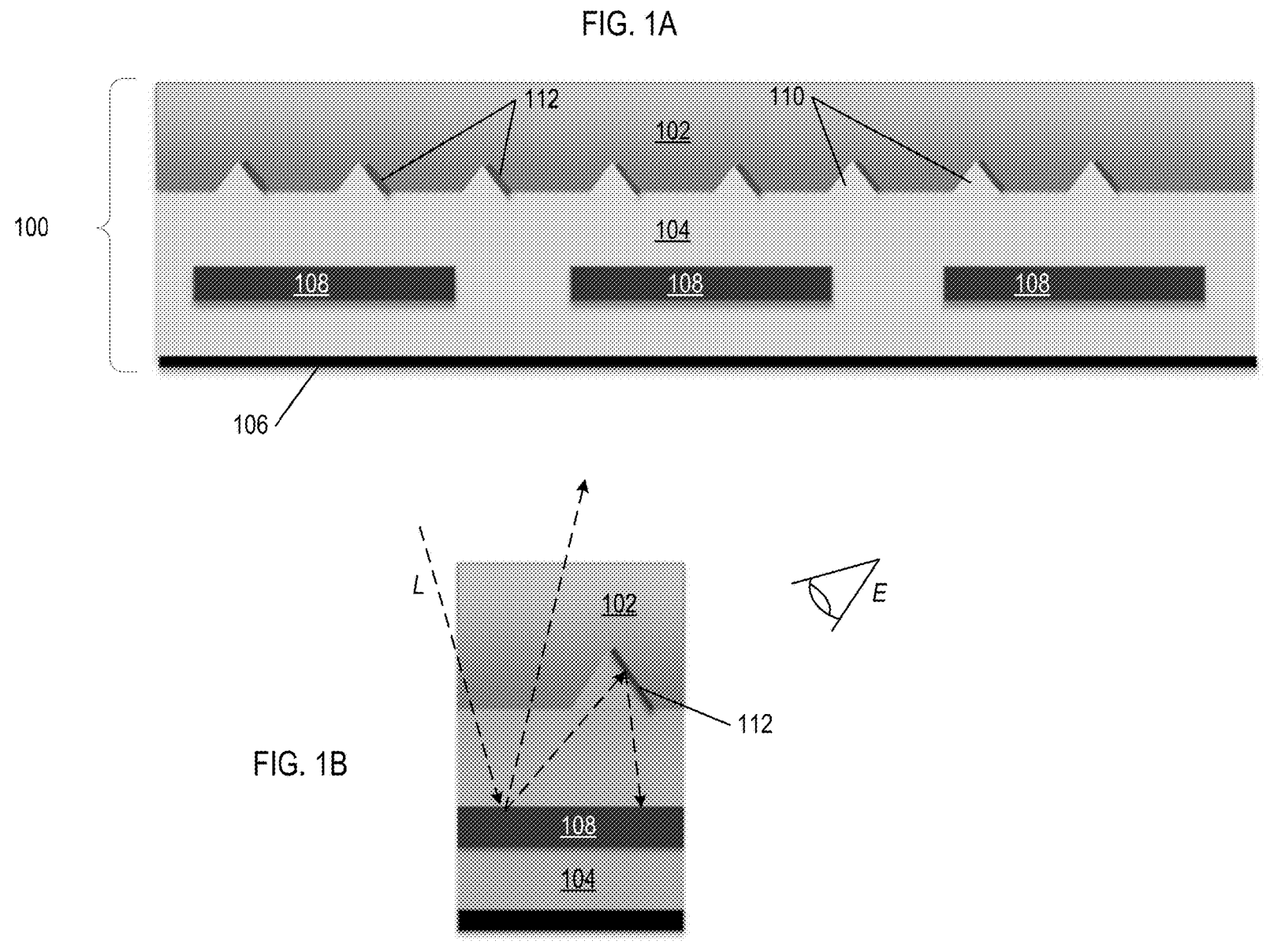

FIG. 1A shows first micro louvered PV laminate stack 100 for use in a solar roof tile, shingle, panel, module, or other structure in accordance with at least one exemplary embodiment, with FIG. 1B showing a detail view thereof. First micro louvered PV laminate stack 100 is shown in independent cross-section in FIG. 1A, with the understanding that in application, first micro louvered PV laminate stack 100 is part of PV panels for a solar roof installation. First micro louvered PV laminate stack 100 is formed of transparent layer 102 stacked above encapsulant layer 104, with PV cells 108 embedded within encapsulant layer 104. Encapsulant layer 104 is further stacked upon back-sheet 106, where back-sheet 106 can be a reflective, absorbent, or other material as known and used in the PV industry. In many aspects, successive layers of first micro louvered PV laminate stack 100 can be applied or bonded to each other by laminating each layer on top of the immediately adjacent lower layer; in other words, encapsulant layer 104 is layered on back-sheet 106 and transparent layer 102 is layered on encapsulant layer 104.

Transparent layer 102 can be a layer of glass (alternatively referred to as "top glass"), that can be borosilicate glass, soda-lime glass, or other glasses as known and used in the PV industry. Transparent layer 102 is pre-treated (e.g. with a textured glass roller) to form a series of angled notches 110 at the interface between the underside of transparent layer 102 (e.g., the side of transparent layer 102 facing PV cells 108) and the upper surface of encapsulant layer 104. Angled notches 110 can be understood to be formed of the same material as encapsulant layer 104, extending upward at the interface with transparent layer 102. In some aspects, encapsulant layer 104 can be formed of ethylene-vinyl acetate (EVA), although it should be understood that encapsulant layer 104 can be formed of any suitable solar encapsulant material and is not intended to refer to a specific chemical compound. In various embodiments, coating 112 can formed on a portion of angled notches 110, specifically, the portions of angled notches 110 corresponding to a down-roof facing surface when PV laminate stack 100 is part of an installed solar roof tile. Thus, coating 112 applied onto on one side of angled notches 110 can prevent a typical observer viewing the PV panel from seeing embedded PV cells 108; rather the observer, when viewing the PV panel at standard or expected viewing angles, will primarily see coating 112 of first micro louvered PV laminate stack 100. The typical observer can be understood to be an observer located at street or ground level looking upward at a roof where a solar array of PV panels are installed.

In various embodiments, transparent layer 102 can be formed of materials including, but not limited to: ethylene tetrafluoroethylene (ETFE), glass, acrylic, polycarbonate, or glass coated with another thin film having a slightly different index of refraction than the glass. In further aspects, additional thin films applied to a transparent layer can include fluorine-based components that can modify reflection and/or transmission characteristics of the transparent layer, depending on (in the context of the overall stack) which side of the transparent layer that thin film is applied. It can be understood that other transparent layers discussed below in other embodiments can also be formed of such materials. Further, in various embodiments, encapsulant layer 104 can be formed of materials including, but not limited to: ethylene-vinyl acetate (EVA), thermoplastic olefins (TPO), polyvinyl butyral (PVB), or silicones. It can be understood that other encapsulant layers discussed below in other embodiments can also be formed of such materials.

Coating 112 can be or include a dielectric or some other material with a different index of refraction ($I_R$) than transparent layer 102 such that light reflecting off of PV cells 108 is prevented from exiting first micro louvered PV laminate stack 100 at an angle (or within a range of angles) that are visible at ground or street level when first micro louvered PV laminate stack 100 is installed on a sloped roof. In some aspects, coating 112 can have an $I_R$ of from 1.45 to 3.0 (where transparent layer 102 and encapsulant layer 104 generally have an $I_R$ around 1.45 to 1.5). In various embodiments, coating 112 can be a dielectric stack, an inorganic thin film, a non-conductive material, or a sol gel. Further, coating 112 can have a particular color (e.g. having a color that is the same as the non-PV elements of the roof) which can be from a colored film, filter, or dye applied to portions of angled notches 110. Coating 112 can be applied through various processes, including but not limited to chemical vapor deposition (CVD) or physical vapor deposition (PVD), where the deposition can be performed at an angle or controlled with an electron-beam source in order to specifically coat a targeted portion of angled notches 110.

Generally, incident solar radiation (e.g., light L) entering first micro louvered PV laminate stack 100 of a PV panel will be absorbed by PV cells 108 or will reflect off PV cells 108. FIG. 1B further illustrates that when light L enters first micro louvered PV laminate stack 100, any light L that is reflected off of PV cell 108 either (1) exits from transparent layer 102 and an angle that will not be viewable by eye E of an observer, or (2) is blocked and/or redirected by coating 122 applied to a down-roof facing facet of angled notch 110, effectively concealing underlying PV cells 108 from the eye E of an observer. In some aspects, light L that is redirected by coating 112 returns toward PV cell 108 where the solar energy of that light L can be collected. Alternatively, in some aspects, coating 112 may simply cause light L of a specific color or wavelength (λ) band to pass that are different than the inherent or native color of PV cells 108, which can also mask the inherent color of PV cells 108.

Considering first micro louvered PV laminate stack 100 as a whole, it can be said that the micro louver structure, defined by angled notches 110 and coatings 112, begins to "close" as the viewing angle increases (on the side of angled notches 110 having coatings 112) to be closer to the bottom of the horizon. Further, coatings 112 redirected light L back toward PV cells 108 within first micro louvered PV laminate stack 100 both reduce glare emitting from the PV panel and increase the collection of solar energy by PV cells 108.

Figures 2A, 2B:
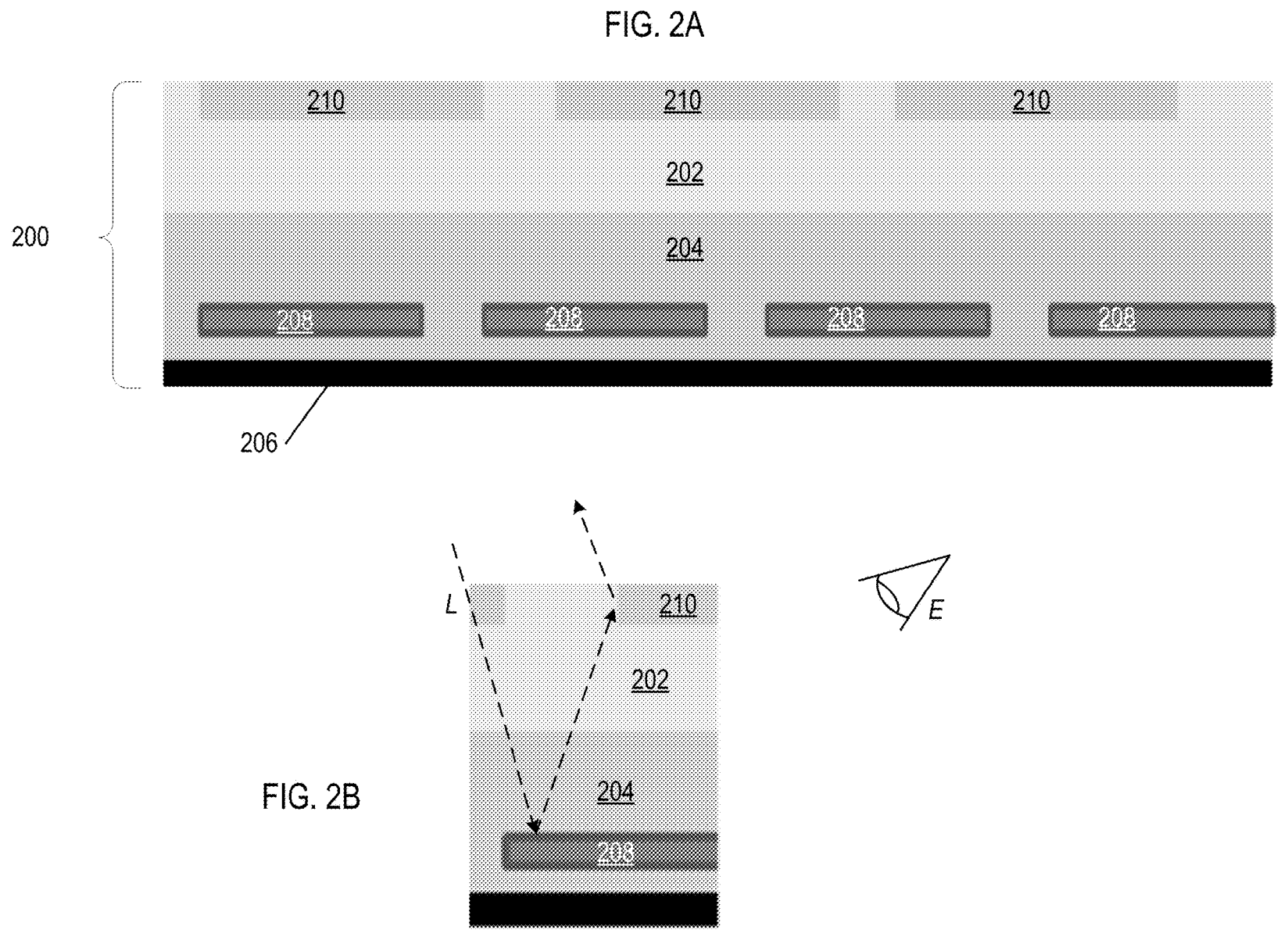

FIG. 2A shows second micro louvered PV laminate stack 200 for use in a solar roof tile, shingle, panel, module, or other structure in accordance with at least one exemplary embodiment, with FIG. 2B showing a detail view thereof. Second micro louvered PV laminate stack 200 is shown in independent cross-section in FIG. 2A, with the understanding that in application, second micro louvered PV laminate stack 200 is part of PV panels for a solar roof installation. Second micro louvered PV laminate stack 200 is formed of transparent layer 202 stacked above encapsulant layer 204, with PV cells 208 embedded within encapsulant layer 204. Encapsulant layer 204 is further stacked upon back-sheet 206, where back-sheet 206 can be a reflective, absorbent, or other material as known and used in the PV industry. In many aspects, successive layers of second micro louvered PV laminate stack 200 can be applied or bonded to each other by laminating each layer on top of the immediately adjacent lower layer; in other words, encapsulant layer 204 is layered on back-sheet 206 and transparent layer 202 is layered on encapsulant layer 204.

In contrast to first micro louvered PV laminate stack 100, second micro louvered PV laminate stack 200 has micro louver structures formed in the upper surface of transparent layer 202 rather than the underside of transparent layer 202. Specifically, material is removed or etched away from the upper surface of transparent layer 202 to form notches, and those notches are filled with refractory material 210. In various aspects, refractory material 210 can be a fluorinated polymer such as ETFE, polyvinylidene fluoride (PVDF), or other suitable material selected for both UV and environmental stability. Both UV and environmental stability (the ability to retain structural and functional characteristics during extended exposure to sunlight and weather as expected as part of a roof) are of importance to refractory material 210 use with second micro louvered PV laminate stack 200, because in many embodiments, upper surface of transparent layer 202 in which refractory material 210 resides is also an exterior-facing surface.

In FIGS. 2A and 2B, the notches in the upper surface of transparent layer 202 are represented as rectangular. It should be appreciated, however, that notches in the upper surface of transparent layer 202 may take on other geometric or even non-geometric shapes to create a micro louvered structure that will allow overhead light to reach PV cells 208 while blocking or redirecting certain angles of light reflected off of PV cells 208.

In second micro louvered PV laminate stack 200, refractory material 210 filling the notches formed in upper surface of transparent layer 202 have a different index of refraction ($I_R$) than transparent layer 202. In many aspects, refractory material 210 will have an $I_R$ less than the $I_R$ of transparent layer 202. In some aspects, refractory material 210 will have an $I_R$ that is different than the $I_R$ of both transparent layer 202 and encapsulant layer 204. In other aspects, refractory material 210 can have an $I_R$ of from 1.0 to 1.5 (where transparent layer 202 and encapsulant layer 204 generally have an $I_R$ around 1.45 to 1.5). In some aspects, notches in transparent layer 202 filled with refractory material 210 can be relatively shallower or deeper than illustrated. In other aspects, notches in transparent layer 202 filled with refractory material 210 can be relatively narrower or wider than illustrated.

The refractory material 210, due to the $I_R$ mismatch with the transparent layer 202, reduces the visible contrast of second micro louvered PV laminate stack 200—in other words, the $I_R$ mismatch creates a relatively blurry surface at the upper surface of transparent layer 202. Accordingly, due at least in part to the blurry surface of transparent layer 202, it is more challenging for PV cells 208 embedded within the encapsulant layer 204 to be distinctly seen by a typical observer. In some aspects, it can be said that the IR mismatch increases the "hiding power" of the overall panel. Hiding power can be understood as the ability of the coating technology to obfuscate the solar cells beneath coatings higher in a stack. For example, a coating technology with a "low hiding power" would still have solar cells be visible in the panel, but the edges of the cells would appear blurred to most observers (e.g. looking at a roof from the ground) such that the observer would not be able to determine where the solar cells end and where the underlying backsheet begins. On the other hand, a coating technology with a "high hiding power" taken at the extreme end of the concept would be a coating of thick black paint. as—applied toward second micro louvered PV laminate stack 200, the depth and width of notches in transparent layer 202 filled with refractory material 210 can vary in order to control or optimize the hiding power of the stack.

FIG. 2B further illustrates that when light L enters second micro louvered PV laminate stack 200, a portion of light L that is reflected off of PV cell 208 is redirected by refractory material 210 to an exit angle that will not be viewable by eye E of an observer, effectively concealing underlying PV cells 208. For light L incident on second micro louvered PV laminate stack 200, the redirecting effect of refractory material 210 is incidental to the energy collecting function, as that light L still reaches underlying PV cells 208. Other portions of light L passing up through transparent layer 202 and encapsulant layer 204 of second micro louvered PV laminate stack 200 can be reflected back down toward PV cell 208 where the solar energy of that light L can be collected.

FIG. 3A shows third micro louvered PV laminate stack 300 for use in a solar roof tile, shingle, panel, module, or other structure in accordance with at least one exemplary embodiment, with FIG. 3B showing a detail view thereof. Third micro louvered PV laminate stack 300 is shown in independent cross-section in FIG. 3A, with the understanding that in application, third micro louvered PV laminate stack 300 is part of PV panels for a solar roof installation. Third micro louvered PV laminate stack 300 is formed of transparent layer 302 stacked above encapsulant layer 304, with PV cells 308 embedded within encapsulant layer 304. Encapsulant layer 304 is further stacked upon back-sheet 306, where back-sheet 306 can be a reflective, absorbent, or other material as known and used in the PV industry. In many aspects, successive layers of third micro louvered PV laminate stack 300 can be applied or bonded to each other by laminating each layer on top of the immediately adjacent lower layer; in other words, encapsulant layer 304 is layered on back-sheet 306 and transparent layer 302 is layered on encapsulant layer 304.

Third micro louvered PV laminate stack 300 further includes anti-reflective coating (ARC) 310 applied over and on top of transparent layer 302. In some aspects, ARC 310 can be a slightly porous material (e.g. a sol gel) that can take and set a stain within regions of ARC 310 via capillary action. Specific portions of ARC 310, a periodic sequence of refraction bands 312, are stained with a material that modifies the index of refraction for refraction bands 312. Refraction bands 312 can be formed within ARC 310 using a mask or other known techniques for imparting color into such materials and surfaces. In some aspects, refraction bands 312 can have a depth that is equal to the height of ARC 310, while in other aspects, refraction bands 312 can have a depth that is less than the height of ARC 310. Period 314 represents the space between adjacent stained refraction bands 312, which can be distributed through ARC 310 at various densities, from a sparse distribution to being effectively completely covered, and at any density in between. Refraction bands 312 can be distributed randomly or according to regular patterns within ARC 310. The stain used for refraction bands 312 can contain pigments of various colors, selected to match or complement other sections of a solar roof. Indeed, in some aspects, refraction bands 312 can have a stain or $I_R$ such that light L which reaches refraction bands 312 is effectively absorbed (and in such aspects refraction bands 312 can alternatively be referred to as absorption bands). Both period 314 and the width of refraction bands 312 can be configured (in combination) to block or refract light reflected off of PV cells 308 within a range of angles that would otherwise be visible to a typical observer. The width of refraction bands 312 can vary, limited only by the size of the solar roof element and ARC 310 in which refraction bands 312 are located. Similarly, period 314 of refraction bands 312 can vary, limited only by the size and shape of solar roof element in which they are located.

In various embodiments, stains of refraction bands 312 can be arranged to have a specific color, width (e.g., >100 μm, about 100 μm, <100 μm), depth (e.g., about 50 μm, a fraction of the total depth of the ARC, the full depth of the ARC), and period 314 (e.g., less than 100 μm between individual refraction bands 312, about 100 μm between individual refraction bands 312, greater than 100 μm between individual refraction bands 312). Refraction bands 312 can be set within ARC 310 with any combination of width, depth, and period 314, as appropriate for a given roofing installation. Accordingly, staining with refraction bands 312 as part of third micro louvered PV laminate stack 300 can be arranged such that a typical observer does not see PV cells 308 embedded within encapsulant layer 304, but rather sees a pattern or coloration based on the arrangement of the refraction bands 312 within ARC 310.

FIG. 3B further illustrates that when light L enters third micro louvered PV laminate stack 300, a portion of light L that is reflected off of PV cell 308 is absorbed by refraction bands 312, preventing reflected light L from reaching eye E of an observer, effectively concealing underlying PV cells 308. For light L incident on third micro louvered PV laminate stack 300, the width and period of refraction bands 312 in ARC 310 allows for light L to reach PV cells 308. Other portions of light L passing up through transparent layer 302 and encapsulant layer 304 may pass through and exit third micro louvered PV laminate stack 300, but amount of this portion of light L reaching eye E of an observer is controlled and minimized by refraction bands 312.

Figures 4A, 4B:
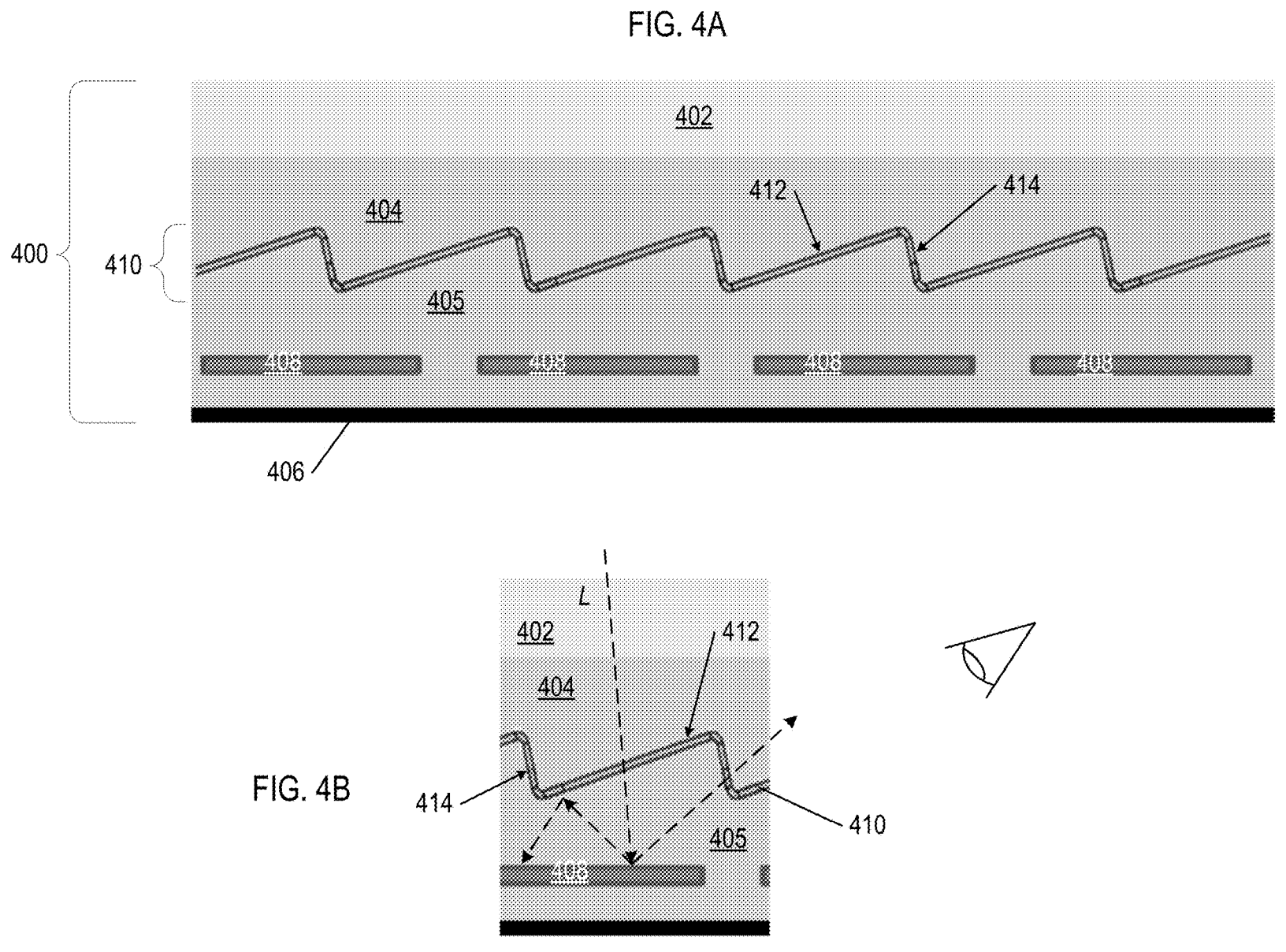

FIG. 4A shows fourth micro louvered PV laminate stack 400 for use in a solar roof tile, shingle, panel, module, or other structure in accordance with at least one exemplary embodiment, with FIG. 4B showing a detail view thereof. Fourth micro louvered PV laminate stack 400 is shown in independent cross-section in FIG. 4A, with the understanding that in application, fourth micro louvered PV laminate stack 400 is part of PV panels for a solar roof installation. Fourth micro louvered PV laminate stack 400 is formed of transparent layer 402 stacked above upper encapsulant layer 404 and lower encapsulant layer 405, with PV cells 408 embedded within lower encapsulant layer 405. Lower encapsulant layer 405 is further stacked upon back-sheet 406, where back-sheet 406 can be a reflective, absorbent, or other material as known and used in the PV industry. In many aspects, successive layers of fourth micro louvered PV laminate stack 400 can be applied or bonded to each other by laminating each layer on top of the immediately adjacent lower layer; in other words, lower encapsulant layer 405 is layered on back-sheet 406 and transparent layer 402 is layered on upper encapsulant layer 404.

Fourth micro louvered PV laminate stack 400 further includes refractory film 410, embedded between upper encapsulant layer 404 and lower encapsulant layer 405, above PV cells 408 within the stack. Refractory film 410 provides another approach for concealing or changing the wavelength of reflected light from underlying PV cells 408 in fourth micro louvered PV laminate stack 400 within a solar roof tile. In forming fourth micro louvered PV laminate stack 400, refractory film 410 is applied over lower encapsulant layer 405, and then upper encapsulant layer 404 is layered on top of refractory film 410 such that crimped film is embedded between both encapsulant layers. Upper encapsulant layer 404 and lower encapsulant layer 405 are made of the same material, while refractory film 410 has a different $I_R$ than the encapsulant layers. In some aspects, refractory film 410 can have an $I_R$ of approximately 1.6-2.0. In other aspects, refractory film 410 can have a lower $I_R$ than upper encapsulant layer 404 and lower encapsulant layer 405, and would allow for internal reflection of light a relatively low angles.

In various embodiments, refractory film 410 can have a saw-tooth, crimped, or stepped geometry with long treads 412 and (relatively) short risers 414. In various embodiments, short riser 414 portions can be coated with a dielectric stack, an inorganic thin file, a non-conductive material, or a sol gel, where the coating can optionally also be colored. Short risers 414 of refractory film 410 will face the down-roof direction when solar roof tiles containing fourth micro louvered PV laminate stack 400 are installed on a roof. The coating may prevent light from escaping at an angle that would be visible form the street, or, as in other embodiments, may simply cause any reflected light that is emitted to be of a particular color or wavelength. Preferably, the color or wavelength will be selected to conceal the natural color of the underlying PV cells.

In some embodiments, the shape of refractory film 410 can be referred to as saw-tooth. Generally, textured glass (when uncoated) helps to make the underlying PV cells of a PV panel more visible at low angles as compared to smooth glass which internally reflects light. A saw-tooth structure can be understood to implement this characteristic and function of textured glass asymmetrically, controlling the low angles of visibility to certain observers, while maximizing the surfaces for internal reflection and capture of solar energy. With a saw-tooth texture or pattern, long treads 412 are facets that have a shallower angle with respect to the bottom of transparent layer 402, while short risers 414 are facets that have a steeper angle with respect to the bottom of transparent layer 402. Long treads 412 point more directly toward the path of the sun while short risers 414 are relatively obscured from the sun, and accordingly short risers 414 point more directly toward a viewer on the street. Refractory film 410 having a saw-tooth angle of between ten degrees (10°) and twenty degrees (20°), mounted on a roof having a pitch ratio of between 4:12 and 6:12, would present mostly or only short risers 414 in a down-roof direction, to a typical observer viewing the panel from the ground/street.

In alternative embodiments, refractory film 410 can be located at the interface of transparent layer 402 and upper encapsulant layer 404 (i.e. similar to FIGS. 1A & 1B). In further alternative embodiments, refractory film 410 can be located or structured on the top surface of transparent layer 402 (i.e. similar to FIGS. 2A & 2B). In various aspects, refractory film 410 can be formed of a fluoropolymer or other material, having a relatively low $I_R$, as compared to any adjacent encapsulant or transparent materials.

Incident solar radiation (e.g., light L) entering fourth micro louvered PV laminate stack 400 of a PV panel will pass through transparent layer 402, upper encapsulant layer 404, refractory film 410, and lower encapsulant layer 405 and then be absorbed by PV cells 408 or will reflect off PV cells 408. FIG. 4B further illustrates an additional advantage provided by refractory film 410, in that when light L enters fourth micro louvered PV laminate stack 400 from a relatively high angle (e.g. close to normal), such light L that is reflected off of PV cell 408 and interfaces with long treads 412 will be reflected back toward PV cells 408. Some light L that is reflected off of PV cell 408 does pass through short treads 414 and continues to pass through upper encapsulant layer 404 and exits from transparent layer 402.

It should be understood that transparent layers and encapsulant layers as considered herein can be made of the same or similar materials for the various embodiments, respectively. Conversely, transparent layers and encapsulant layers can be made of different materials across the various embodiments, respectively. Refractory structure materials used across the various embodiments can also be formed of the same, similar, or different materials. In further alternative embodiments, structures and functional aspects of two or more of the micro louvered PV laminate stacks can be incorporated with each other in the same PV stack.

Figures 5, 6:
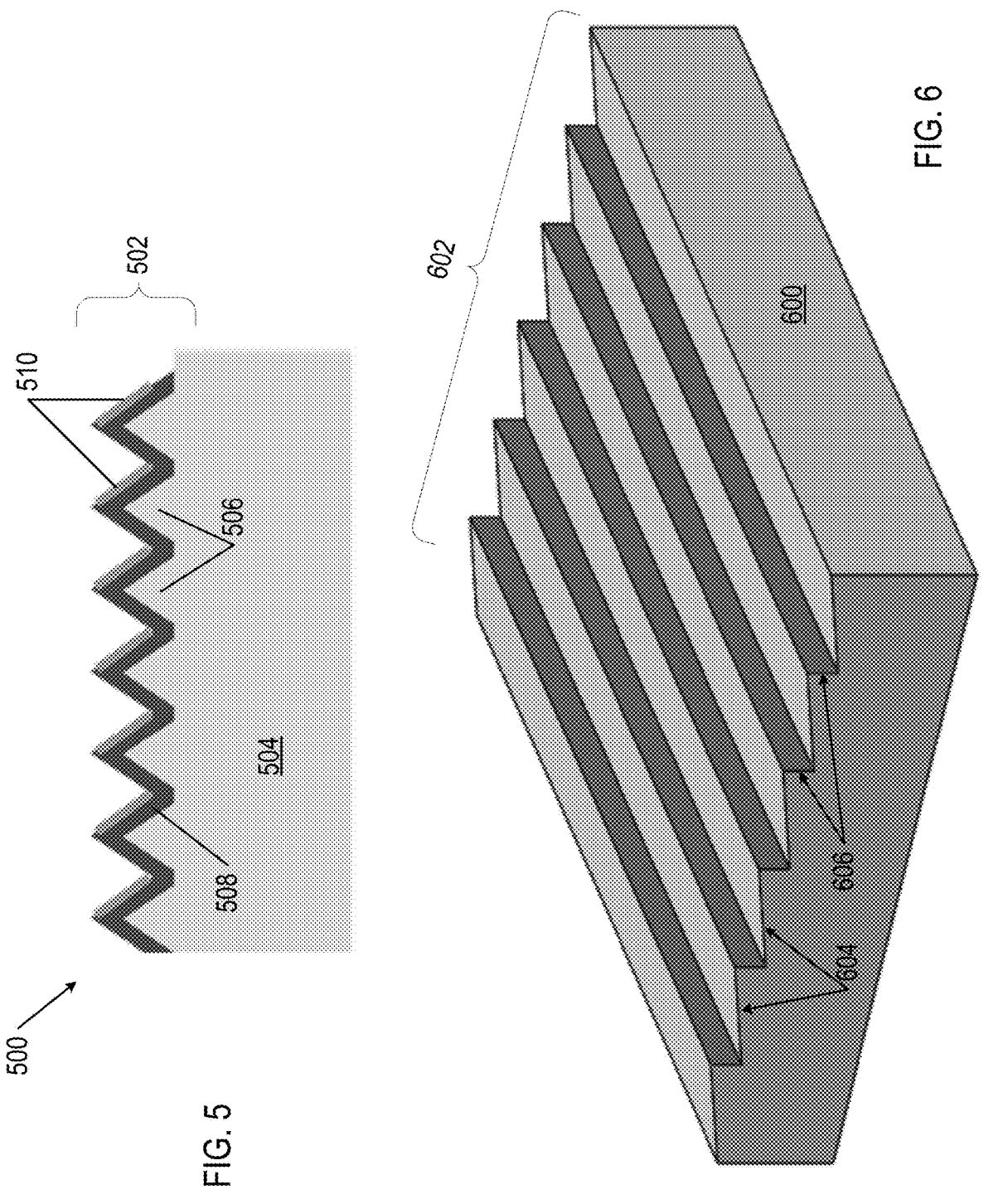
FIG. 5 shows a portion of a solar cell having a micro louver structure, according to various embodiments of this technology.
FIG. 6 shows a top glass structure used for PV laminate stacks, having a saw-tooth structure, according to various embodiments of this technology.

FIG. 5 shows a portion of solar cell 500 having micro louver structure 502 that differs from previous embodiments in that the micro louver structure 502 and effect is accomplished by treating the top of solar cell 500 rather than embedded between or within one of the subsequent upper layers of the overall laminate PV stack. Specifically, top surface of solar cell 500 can be manufactured with a texture. In the exemplary embodiment of FIG. 5, the texture is uniform—a series of inverted pyramids 506 formed on a top surface of silicon substrate 504. In other embodiments, a randomized texture may be formed into the top surface of silicon substrate 504. After inverted pyramids 506 (or other uniform or randomized texture) are formed, an anti-reflective coating (ARC) 508 such as silicon nitride or indium tin oxide (ITO) is deposited over that texture. Secondary dielectric coating 510 having a different index or refraction, or having a different color, is applied on top of ARC 508 layer at an angle with respect to solar cell 500. In some aspects, a difference in color can be achieved by varying the thickness of ARC 508; for example, a thicker layer of silicon nitride could provide for a darker colored or darker hued appearance of solar cell 500. By angling either the direction of application or orientation of solar cell 500, facets of inverted pyramids 506 facing the same direction will receive more of secondary dielectric coating 510 than others surfaces of the texture. The differential application of secondary dielectric coating 510 gives an orientation to solar cell 500 that affects the direction and/or intensity of light reflected through the coated facets of inverted pyramids 506. If resultant solar cells 500 are installed in a solar roof tile or shingle such that coated facets of micro louver structure 502 are facing down-roof, solar cells 500 will create a micro louver effect without requiring additional layers, films, or glass surface treatments.

FIG. 6 shows top glass 600 used as the uppermost layer of laminate PV stacks, having saw-tooth structure 602 that differs from previous embodiments in that the micro louver effect is achieved by saw-tooth structure 602 textured into the upper surface of top glass 600, rather than embedded between or within one of the subsequent lower layers of the overall laminate PV stack. Saw-tooth structure 602 has long facets 604 that have a shallower angle with respect to the bottom surface of top glass 600, as well as short facets 606 that have a steeper angle with respect to the bottom surface of top glass 600. Long facets 604 point more directly toward the path of the sun as the sun moves through degrees of altitude. Short facets 606 are relatively obscured from the sun, instead pointing more directly toward a viewer on the street. Saw-tooth structure 602 having angles of between ten degrees (10°) and twenty degrees (20°), mounted on a roof having a pitch ratio of between 4:12 and 6:12, would present mostly or only short facets 606 to a typical observer viewing the panel from the ground/street. The saw-tooth angles of saw-tooth structure can be considered to be and measured as the cosine of short facet 606 over long facet 604.

Figure 7A:
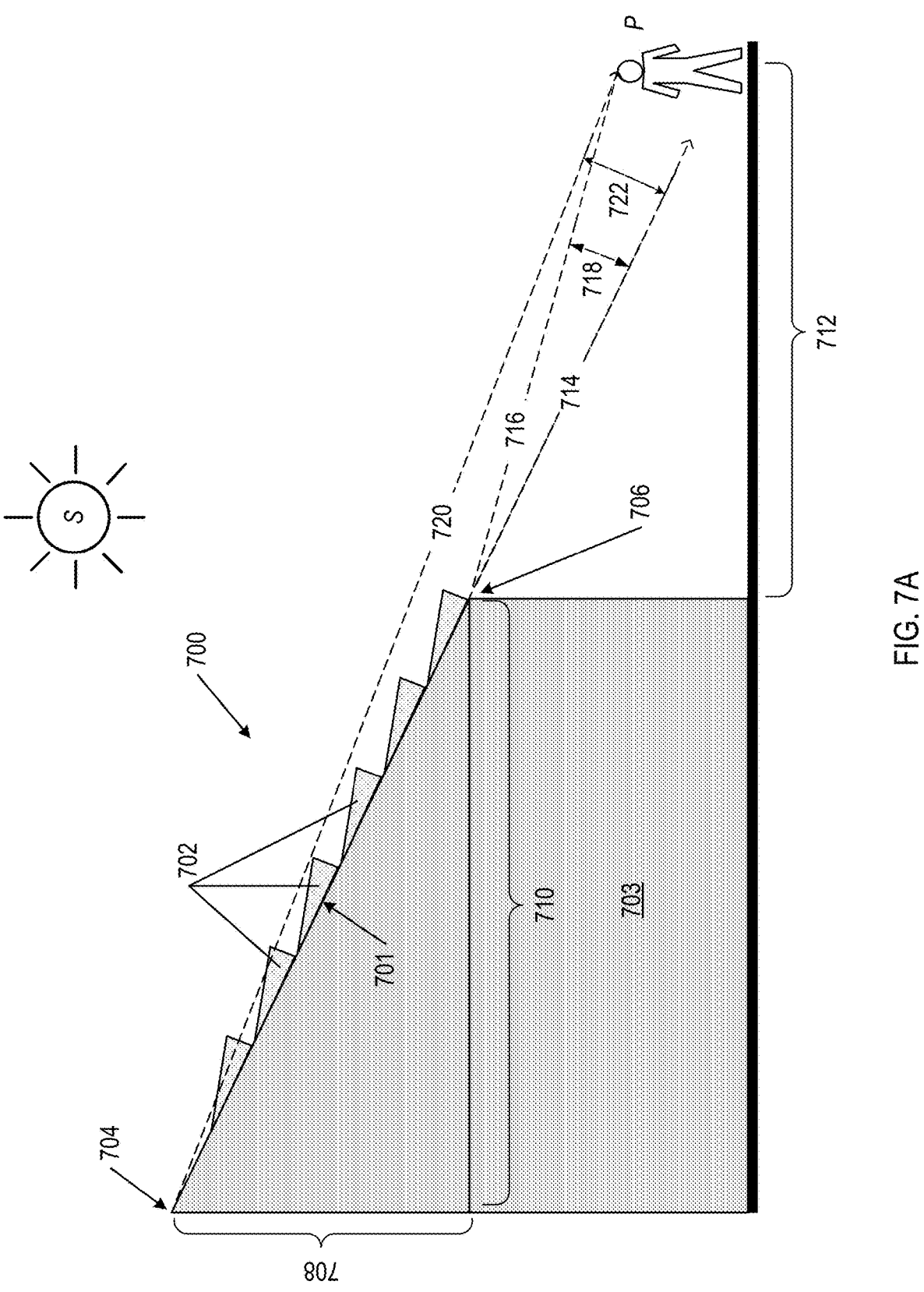
FIG. 7A shows an schematic representation of a roofing system applying a micro louvered PV laminate stack according to various embodiments of this technology.
Figure 7B:
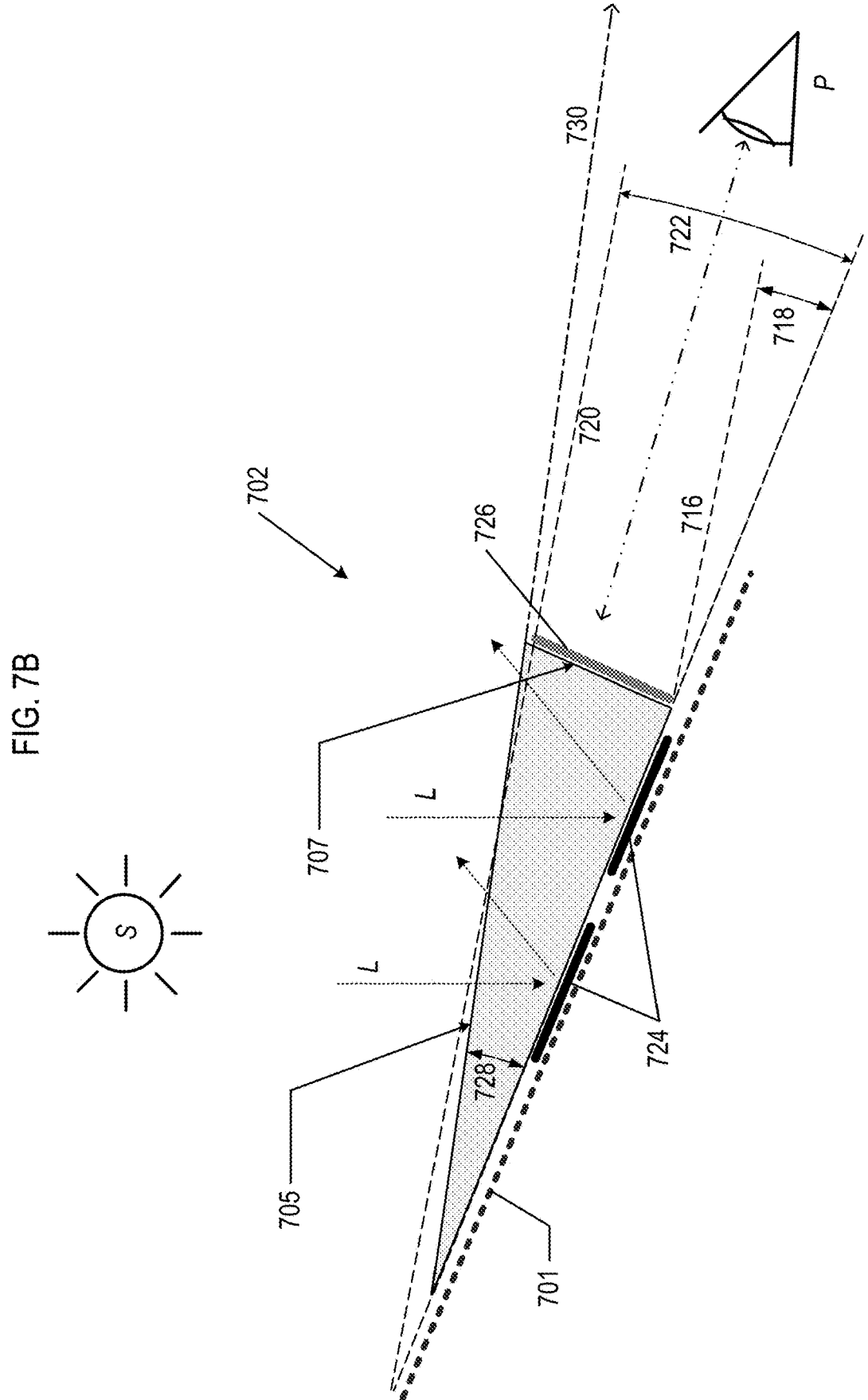
FIG. 7B shows a detail view of the schematic micro louvered PV laminate stack shown in FIG. 7A.

FIG. 7A shows an schematic representation of roofing system 700 having wedge-textured optics 702, with FIG. 7B showing a detail of schematic wedge-textured optics 702 shown in FIG. 7A. Specifically, wedge-textured optics 702 is shown as exaggerated in size on roof 701 of structure 703 in order to emphasize long facets 705 and short facets 707 as oriented in relation to slope 714 of roof 701. Wedge-textured optics 702 can be understood as a top glass layer having a wedge-shaped texture, which can also be alternatively referred to as a saw tooth optical structure. Such wedge-shaped or saw tooth profiles can have uniform or variable shape and length. In some implementations, long facets 705 can have a variable length along slope 714 of roof 701, being progressively shorter or longer in length when positioned proximate to ridge 704 or eave 706. In other implementations, long facets 705 can have a variable length along slope 714 of roof 701 randomly distributed over surface of roof 701. In further aspects, long facets 705 can have a curved shape, providing for different presentation angles of short facets 707 to observers on the ground. Such various implementations of wedge-textured optics 702 can impart a relatively more organic and natural construction appearance to roof 701.

Every roof 701 has a pitch between ridge 704 and eave 706, defined as rise 708 over run 710, with corresponding slope 714, which can be referred to as a pitch. Typically, about 80% of residential roofs have a pitch (or "pitch ratio") of between 4:12 and 6:12. In the exemplary schematic of FIG. 7A, the pitch is considered to be 5:12, which would, for example, correspond to roof 701 having rise 708 of ten feet (10') and run 710 of twenty-eight feet (28').

Roofing system 700 is oriented and arranged such that that a typical observer P standing on even ground with structure 703 at viewing distance 712 will not distinctly see solar cells within wedge-textured optics 702. To accomplish this, wedge-textured optics 702 of roofing system 700 are configured such that short facets 707 will cover the full range of presentation angles of roof 701 as viewed by a typical observer. Accordingly, a range of presentation angles is determined, with an upper bound set as eave sightline 716 (i.e., the line of sight between the typical observer P and eave 706) having eave viewing angle 718 (i.e., the angle between roof 701 slope 714 and eave sightline 716). The lower bound of the range of presentation angles is set as ridge sightline 720 (i.e., the line of sight between the typical observer P and ridge 704) having ridge viewing angle 722 (i.e., the angle between roof 701 slope 714 and ridge sightline 722).

In an exemplary embodiment, where viewing distance 712 is twenty feet (20') from structure 703, and where typical observer P is six feet (6') tall, eave viewing angle 718 will be 14.09° and ridge viewing angle 722 will be 6.16°. In another example, where viewing distance 712 is thirty feet (30') from structure 703, and where typical observer P is six feet (6') tall, eave viewing angle 718 will be 16.91° and ridge viewing angle 722 will be 9.08°. Accordingly, the range of presentation angles can vary depending on the unique characteristics of each structure 703 and roof 701, and wedge-textured optics 702 of roofing system 700 is able to account for such variation. In complementary fashion, the surface area exposed by long facets to 705 to light L from the sun S is relatively large. Indeed, in some aspects, long facets 705 allow for light to enter and reach solar cells 724 for a relatively longer period of time during the day, as the surface area of long facets 705 remains exposed to the sun S for a relatively period of its altitude path as opposed to solar cells that only follow the slope of a roof.

Wedge-textured optics 702 of roofing system 700 having a saw-tooth structure (e.g. as seen in FIGS. 4A, 4B, & 6) can have saw-tooth angle 728 of from ten to twenty degrees (10°-20°) which would present mostly only the surfaces of short facets 707 to a typical observer P at viewing distance 712 of from about twenty to about thirty feet. It can be further understood that down-roof facing surfaces of other micro louvered PV laminate stacks (e.g., as seen in FIGS. 1A, 1B, & 5) can also be angled such that a typical observer P viewing such micro louvered PV laminate stacks at an expected range of presentation angles will not distinctly see underlying solar cells in that micro louvered PV laminate stack. In other words, long facets 705 can have saw-tooth slope 730, where to control the viewable surface by a typical observer P, the angle formed by long facets 705 and a typical observer P is greater than or equal to 180°, which extends past saw-tooth slope 730 (for reasonable and typical roof heights, viewing distances, and roof pitches).

In some embodiments, saw-tooth angle 728 above thirty degrees (>30°) can be used for wedge-textured optics 702 that are configured to optimize the amount of light presented by the sun S. Wedge-textured optics 702 having saw-tooth angle 728 at 30° or greater (with corresponding eave viewing angle 718 and ridge viewing angle 722) are configured such that the ratio of the area of solar cells 724 obscured by short facet 707 compared to the area of solar cells 724 exposed to light L through long facet 705 is small (e.g., less than or equal to 1:2, 1:3, ≤1:4, ≤1:5, ≤1:6, ≤1:8, ≤1:10, ≤1:20, etc.). In all embodiments, a majority of light L from the sun S reaches solar cells 724 while a majority of light L reflecting off of solar cells 724 does not reach the eye of a typical observer P.

In many embodiments, short facets 707 of micro louvered PV laminate stacks 702 can be covered with coating 726, which in various aspects can be a reflective material, a dielectric film, and/or a colored element, as discussed above. The eye of a typical observer P, viewing wedge-textured optics 702 with saw-tooth angle 728 covering an expected range of presentation angles (i.e., covering the range between ridge sightline 720 and eave sightline 716) would accordingly only see coating 726 when viewing roof 701 and roofing system 700.

Figure 8:
FIG. 8 shows an exemplary textured glass as the top-most layer of a micro louvered PV laminate stack according to various embodiments of this technology.

In some embodiments, micro louvered PV laminate stacks and wedge-textured optics can have a top-most layer of textured glass (e.g., having a pattern mimicking tree bark) as means of concealing wires, linear edges, etc. Generally, such top-most textured glass layers will have patterns designed to replicate organic textures, similar to natural materials otherwise used to build roofs. FIG. 8 shows an exemplary textured glass as the top-most layer of a micro louvered PV laminate stack, which can be referred to as a PV tile. In many aspects, textured glass includes features that approximately align, but deviate in an erratic or randomized way, with respect to the strong contrasting features within the cell such as wire patterns and cell edges for the purpose of concealing those features. In particular, such textured patterning is effective at concealing such features at viewing or presentation angles that are between zero to thirty degrees (0°-30°), as measured from the bottom surface of the glass plane. Any light reaching the eye of a typical observer from such a textured glass is generally light that has been reflected from surfaces other than light reflected off of solar cells within the PV structure. In other words, light incident on solar cells within a textured glass that is generally aligned with the vertical arrangement of the textured glass on a roof is more likely to reflect internally within the textured glass, along up-roof and down-roof directions, which would otherwise be the light most likely to be seen by a typical observer. Light incident on textured glass coming in from more extreme angles (e.g., from the left or right of a vertically oriented PV tile) is less likely to reach solar cells within a PV tile, and such light striking the textured glass at large angles (off-normal) may be transmitted in directions that could be seen by a typical observer.

Figure 9:
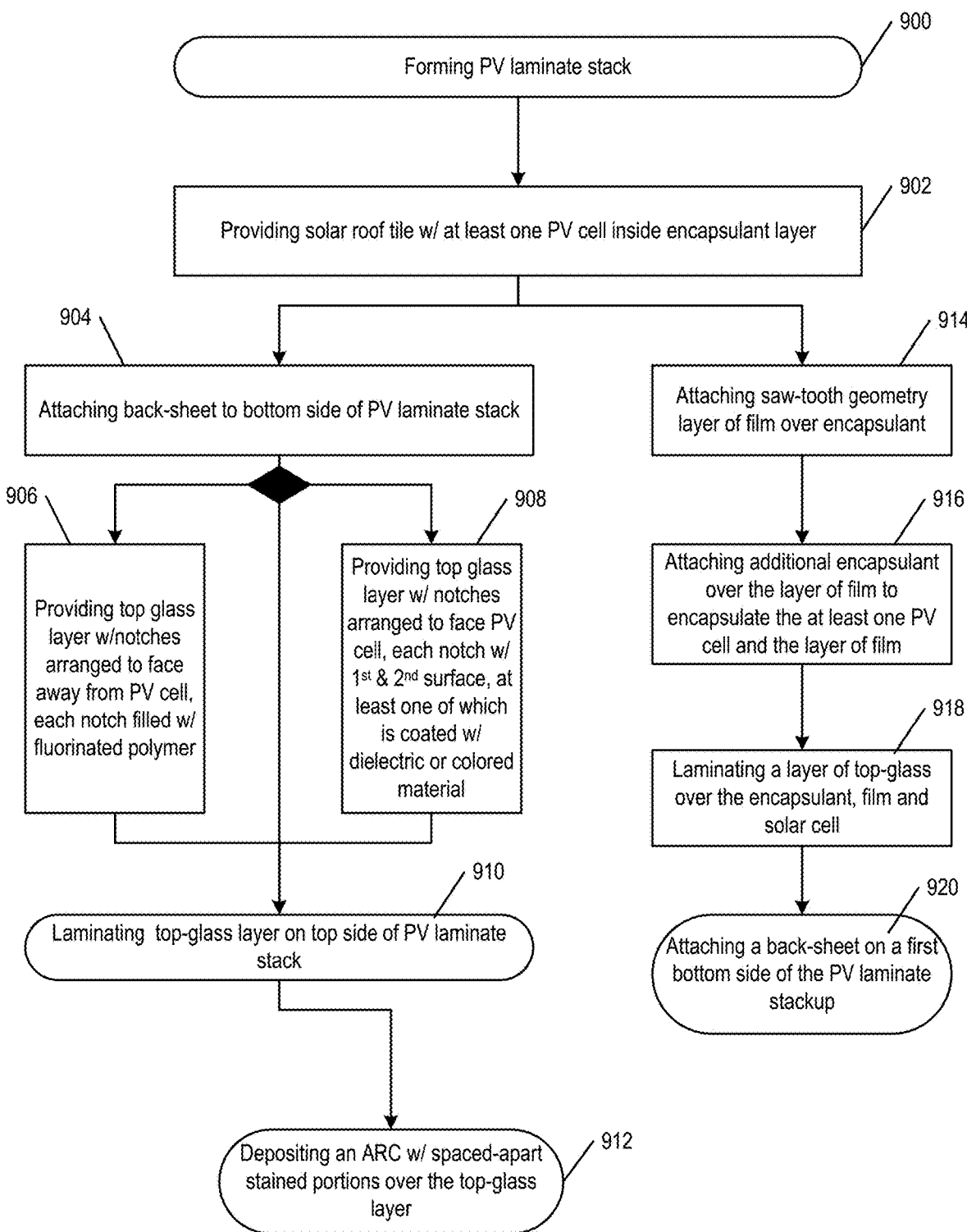
FIG. 9 shows an flowchart with exemplary methods of forming a PV laminate stack with louvered effects according to various embodiments of this technology.

In various embodiments as shown in FIG. 9, methods for forming a louvered effect in a solar roof can be achieved according to steps as set forth below. In one implementation, forming a louvered effect in a solar roof tile at step 900 can be achieved by: at step 902, forming a PV laminate stack-up having at least one PV cell inside a layer of encapsulant on a portion of the solar roof tile; at step 904, attaching a back-sheet on a first, bottom side of the PV laminate stack-up; and at step 910, laminating a top-glass layer on a second, top side of the PV laminate stack-up, following step 906 where the top-glass layer has a plurality of notches formed on a PV cell facing side, each notch having a first surface and a second surface, at least one of the surfaces coated with a either a dielectric material or a colored material. In another implementation, forming a louvered effect in a solar roof tile at step 900 can be achieved by: at step 902, forming a PV laminate stack-up having at least one PV cell inside a layer of encapsulant on a portion of a solar roof tile; at step 904, attaching a back-sheet on a first bottom side of the PV laminate stack-up; and at step 910, laminating a top-glass layer on a second, top side of the PV laminate stack-up, following step 908 where the top-glass layer has a plurality of notches formed on a sky-facing side (i.e., away from the PV cell), each notching having a recess filled with a UV and environmentally stable fluorinated polymer. In a further implementation, forming a louvered effect in a solar roof tile at step 900 can be achieved by: at step 902, forming a PV laminate stack-up having at least one PV cell inside a layer of encapsulant on a portion of a solar roof tile; at step 904, attaching a back-sheet on a first bottom side of the PV laminate stack-up; at step 910, laminating a top-glass layer on a second, top side of the PV laminate stack-up; and at step 912, depositing an anti-reflective coating over the top-glass layer, where the anti-reflective coating has a plurality of spaced-apart stained portions, the stained portions having a different index of refraction than the native index of refraction of the anti-reflective coating. In an alternative implementation, forming a louvered effect in a solar roof tile at step 900 can be achieved by: at step 902, forming a PV laminate stack-up having at least one PV cell inside a layer of encapsulant on a portion of a solar roof tile; at step 914, attaching layer of film over the layer of encapsulant, the layer of film having a saw-tooth geometry; at step 916, attaching additional encapsulant over the layer of film to encapsulate the at least one PV cell and the layer of film; at step 918, laminating a layer of top-glass over the encapsulant, film and solar cell; and at step 920, attaching a back-sheet on a first bottom side of the PV laminate stack-up.

Figure 10:
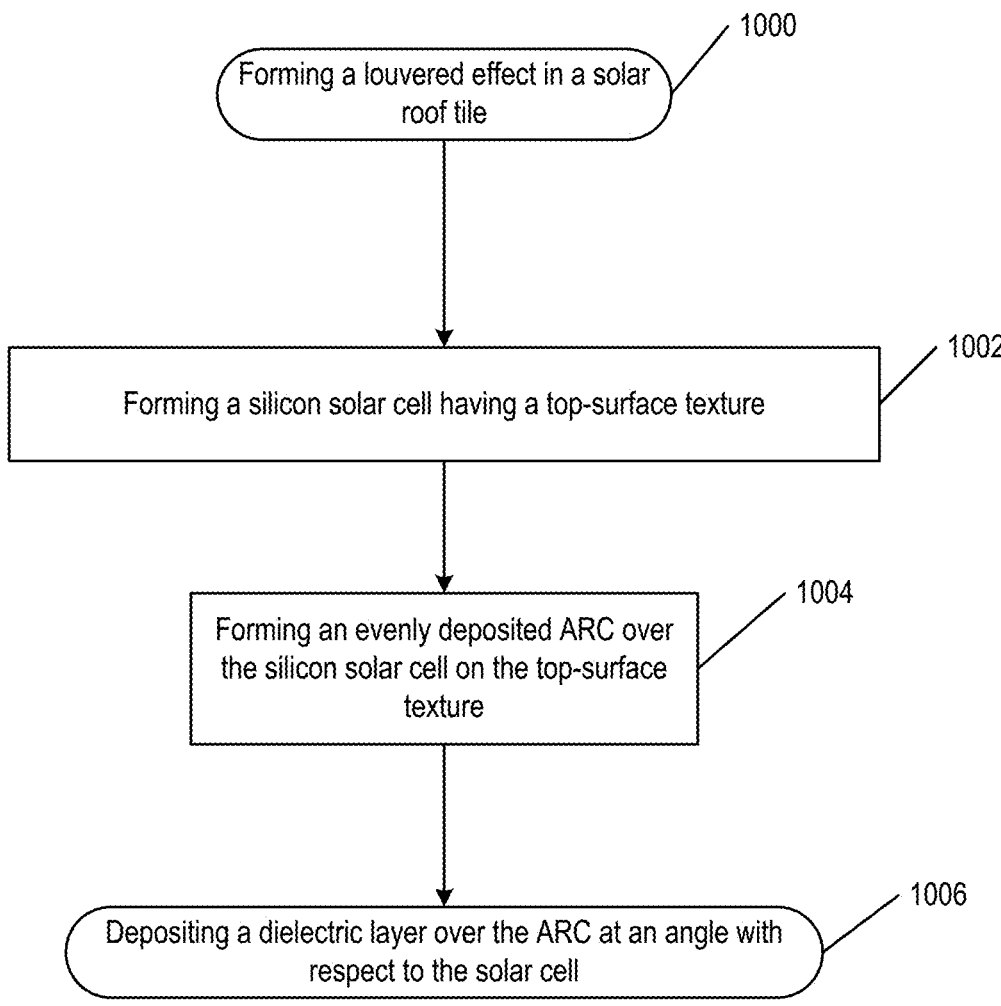
FIG. 10 shows an flowchart an exemplary method of forming a solar roof tile with louvered effect according to various embodiments of this technology.

In some implementations as shown in FIG. 10, forming a louvered effect in a solar roof tile at step 1000 can be achieved by: at step 1002, forming a silicon solar cell, the silicon solar cell having a top-surface texture; at step 1004, forming an evenly deposited anti-reflective coating over the silicon solar cell on the top-surface texture; and at step 1006, depositing a dielectric layer over the anti-reflective coating, the dielectric layer deposited at an angle with respect to the solar cell to give the solar cell an orientation, thereby changing the optical properties of the cell where the dielectric layer is deposited.

Materials that can be used to form ARC films as discussed herein can include, but are not limited to: indium-tin oxide (ITO), silicon oxides, titanium oxides, tin oxides, zinc oxides, aluminum-zinc oxide (AZO), silicon nitrides, aluminum nitrides, aluminum oxides, zirconium oxides, titanium-zirconium oxides, niobium oxides, titanium-niobium oxides, hafnium oxides, manganese oxides, tantalum oxides, chromium oxides, bismuth oxides, gallium-zinc oxides (GZO), as well as mixtures, variations, and combinations thereof. Such materials can be used in for any ARC thin film layer system, or optionally as heat-conductive or anti-condensation thin films.

From the foregoing, it will be appreciated that specific embodiments of the invention have been described herein for purposes of illustration, but that various modifications may be made without deviating from the spirit and scope of the various embodiments of the invention. Further, while various advantages associated with certain embodiments of the invention have been described above in the context of those embodiments, other embodiments may also exhibit such advantages, and not all embodiments need necessarily exhibit such advantages to fall within the scope of the invention. Accordingly, the invention is not limited, except as by the appended claims.

While the above description describes various embodiments of the invention and the best mode contemplated, regardless how detailed the above text, the invention can be practiced in many ways. Details of the system may vary considerably in its specific implementation, while still being encompassed by the present disclosure. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

The teachings of the invention provided herein can be applied to other systems, not necessarily the system described above. The elements and acts of the various examples described above can be combined to provide further implementations of the invention. Some alternative implementations of the invention may include not only additional elements to those implementations noted above, but also may include fewer elements. Further any specific numbers noted herein are only examples; alternative implementations may employ differing values or ranges, and can accommodate various increments and gradients of values within and at the boundaries of such ranges.

References throughout the foregoing description to features, advantages, or similar language do not imply that all of the features and advantages that may be realized with the present technology should be or are in any single embodiment of the invention. Rather, language referring to the features and advantages is understood to mean that a specific feature, advantage, or characteristic described in connection with an embodiment is included in at least one embodiment of the present technology. Thus, discussion of the features and advantages, and similar language, throughout this specification may, but do not necessarily, refer to the same embodiment.

Furthermore, the described features, advantages, and characteristics of the present technology may be combined in any suitable manner in one or more embodiments. One skilled in the relevant art will recognize that the present technology can be practiced without one or more of the specific features or advantages of a particular embodiment. In other instances, additional features and advantages may be recognized in certain embodiments that may not be present in all embodiments of the present technology.

Any patents and applications and other references noted above, including any that may be listed in accompanying filing papers, are incorporated herein by reference. Aspects of the invention can be modified, if necessary, to employ the systems, functions, and concepts of the various references described above to provide yet further implementations of the invention.

Unless the context clearly requires otherwise, throughout the description and the claims, the words "comprise", "comprising", and the like are to be construed in an inclusive sense, as opposed to an exclusive or exhaustive sense; that is to say, in the sense of "including, but not limited to". As used herein, the terms "connected", "coupled", or any variant thereof means any connection or coupling, either direct or indirect, between two or more elements; the coupling or connection between the elements can be physical, logical, or a combination thereof. Additionally, the words "herein", "above", "below", and words of similar import, when used in reference to the text of this application, refer to this application as a whole and not to any particular portions of this application. Where the context permits, words in the above Detailed Description using the singular or plural number may also include the plural or singular number respectively. The word "or", in reference to a list of two or more items, covers all of the following interpretations of the word: any of the items in the list, all of the items in the list, and any combination of the items in the list. Further, as used herein, the terms "and/or" and "at least one of" include any and all combinations of one or more of associated listed items.

Although certain aspects of the invention are presented below in certain claim forms, the applicant contemplates the various aspects of the invention in any number of claim forms. Accordingly, the applicant reserves the right to pursue additional claims after filing this application to pursue such additional claim forms, in either this application or in a continuing application.

The invention claimed is:

1. A photovoltaic (PV) laminate stack, comprising:
   a glass layer;
   an encapsulant layer arranged below the glass layer;
   an anti-reflective coating disposed on a surface of the glass layer and forming an exterior surface of the PV laminate stack, wherein the anti-reflective coating is formed by a sol gel;
   a plurality of solar cells embedded within the encapsulant layer, a portion of the encapsulant layer separating the plurality of solar cells from the glass layer; and
   a plurality of refraction bands positioned in a periodic sequence and formed by staining portions of the anti-reflective coating with a pigment that obscures visibility of the plurality of solar cells, wherein staining is applied so that one or more of the plurality of refraction bands extends from the exterior surface of the PV laminate stack to the surface of the glass layer, wherein adjacent refraction bands are positionally spaced less than 100 microns from one another.

2. The PV laminate stack of claim 1, wherein a first solar cell of the plurality of solar cells is separated from a second solar cell of the plurality of solar cells by a portion of the encapsulant layer.

3. The PV laminate stack of claim 1, further comprising a back-sheet in direct contact with the encapsulant layer.

4. The PV laminate stack of claim 1, wherein staining modifies an index of refraction of a portion of the sol gel forming the anti-reflective coating.

5. The PV laminate stack of claim 3, wherein the encapsulant layer is positioned between the glass layer and the back-sheet and wherein the glass layer is formed of glass.

6. The PV laminate stack of claim 1, wherein one or more of the plurality of refraction bands have a different index of refraction than the anti-reflective coating.

7. The PV laminate stack of claim 1, wherein the pigment forming the plurality of refraction bands is received into the sol gel by capillary action.

8. The PV laminate stack of claim 1, wherein staining is formed from a different material than the anti-reflective coating.

9. The PV laminate stack of claim 1, wherein the pigment includes pigments of a plurality of colors.

* * * * *